United States Patent [19]

Gruodis

[11] Patent Number: 4,939,382
[45] Date of Patent: Jul. 3, 1990

[54] TOUCH RESPONSIVE POWER CONTROL SYSTEM

[76] Inventor: Victor Gruodis, 212 Graney Dr., River Vale, N.J. 07675

[21] Appl. No.: 340,805

[22] Filed: Apr. 20, 1989

[51] Int. Cl.$^5$ ............................................. H05B 37/02
[52] U.S. Cl. ..................................... 307/116; 323/904
[58] Field of Search ......................... 307/116; 323/904

[56] References Cited

U.S. PATENT DOCUMENTS

| | | | |
|---|---|---|---|
| 3,805,096 | 4/1974 | Hamilton | 307/308 |
| 3,919,596 | 11/1975 | Bellis | 315/294 |
| 4,053,789 | 10/1977 | Schultz | 307/116 |
| 4,103,252 | 7/1978 | Bobick | 331/48 |
| 4,119,864 | 10/1978 | Petrizio | 307/116 |
| 4,323,829 | 4/1982 | Witney et al. | 307/116 |
| 4,567,470 | 1/1986 | Yoshikawa et al. | 340/365 C |
| 4,584,519 | 4/1986 | Gruodis | 323/245 |
| 4,651,022 | 3/1987 | Cowley | 307/116 |
| 4,668,877 | 5/1987 | Kunen | 307/116 |
| 4,764,708 | 8/1988 | Roudeski | 307/116 |

OTHER PUBLICATIONS

Reynolds; "Touch Actuated Generator"; Practical Electronics, Jan. 1978, p. 347.

Primary Examiner—Patrick R. Salce
Assistant Examiner—Jeffrey Sterrett
Attorney, Agent, or Firm—Lerner, David, Littenberg, Krumholz & Mentlik

[57] ABSTRACT

A touch responsive power control system in which the majority of the signal processing functions are achieved through digital circuitry and includes a controllable pulse generator responsive to the change in capacitance caused by a human touch at a touch sensitive control point of the device to be regulated. The magnitude of the change in capacitance caused by the human touch is encoded in the form of the number of pulses contained in a pulse train or a series of pulse trains over a selected time period. The number of pulses is counted and digitally compared with a stored count. If the present count is different from the stored count, the stored count is adjusted and an error signal proportional to the difference between counts is supplied, after a sufficient interval, to a load driver which adjusts the power level supplied to the load from an electrical power source.

20 Claims, 16 Drawing Sheets

TOUCH RESPONSIVE POWER CONTROL SYSTEM

This invention relates to a touch responsive power control system in which the magnitude of the power supplied from a power source to an electrically operated device, such as a household appliance or similar device, is regulated in response to human touch.

BACKGROUND OF THE INVENTION

A number of types of human touch responsive power control systems are known in the prior art. Some of these are typically found in various household appliances available on the market, such as in dimmer controls for adjustable intensity lamps. One such system is described and claimed in U.S. Pat. No. 4,584,519 "Incremental Touch-Operated Switch" isued to the present inventor and assigned to the same assignee as this application. Other such systems and touch operated switches typical of the prior art are described in the patents referenced in the aforementioned U.S. Patent.

In my above-referenced U.S. Pat. No. 4,584,519, I provide an apparatus for controlling the application of an AC voltage to a load in which the width or duration of a pulse is controlled by the amplitude of a control voltage which is at least partially a function of the capacitive sense signal. While this system represents a substantial improvement over the prior art, the system as disclosed includes the sensing and application of certain parameters in analog rather than digital form. In most of the prior art systems of this general type, a substantial proportion of the signal processing utilizes analog methods as opposed to digital methods. While digital methods offer certain advantages, a substantially fully digital system having a simplified and reliable mechanization capable of being economically manufactured has not been available.

OBJECTS OF THE INVENTION

Accordingly, it is one object of this invention to provide a touch operated power control system of the general type described above in which the majority of signal processing utilized is digital as opposed to analog.

It is another object of this invention to provide a touch responsive power control system of the general type described in which sensitivity to random noise is greatly reduced, which has more precise and reproducible characteristics and which allows ease of integration to reduce manufacturing costs.

SUMMARY OF THE INVENTION

The present invention is a touch responsive power control system in which the majority of the signal processing functions are achieved through digital circuitry and digital logic operations. In one embodiment thereof, a digital pulse signal is generated by a controllable pulse generator in response to the change in capacitance caused by a human touch at a touch sensitive control point of the device or appliance to be regulated. The digital pulse signal contains information which is a function of the magnitude of the change in capacitance caused by the human touch. In one format, this information is encoded in the form of the number of pulses contained in a pulse train or a series of pulse trains over a selected time period which may, for example, be set by a timing circuit.

The number of pulses in the pulse signal is counted in a digital counter and compared to a stored count through a digital comparator. If the capacitance responsive sensed count (the "present count") is equal to the stored count, no action is taken. If the present count is different from the stored count, the stored count is incremented or decremented in a direction to make the stored count equal to the present count. The correction of the stored count in response to the error signal between the two counts may be delayed by a selected time period to screen out the effects of noise and other spurious signals and it may also be subject to a threshold error level requirement which prevents the system from responding to relatively small input signals.

If the count difference persists after the output pulses are completed, the incrementing or decrementing (whichever has been initiated depending upon the direction of the error) of the storage is initiated to bring the circuit to a new steady state condition. As the stored count is updated, a load controller or load driver, such as a triac, for adjusting the power level supplied from an electrical power source to the load is correspondingly adjusted to set the power level at a new desired setting, which new level is then maintained and regulated by the system. The correction of the setting of the load driver may be accomplished in several modes. In the case of a load driver with a small number of distinct power level settings, for example two to five separate power settings, a single corrective pulse corresponding to one level power change is produced each time the system is activated by a capacitance change produced by a touch at the control point. In the case where the load driver has a large number of fine settings each corresponding to a relatively small difference in power level from the next adjacent one, the corrective response may be to "sweep" continuously through these settings as long as the control signal is applied. In still another mode, the sweep may be selected for a given number of cycles. Various other response modes may be utilized.

The system of the present invention can be utilized to control and regulate the power level to any type of electrical load. It is particularly applicable to control the power delivered to household electrical appliances such as electric lamps and similar devices in response to the human touch, typically applied to some portion of the appliance such as the base of a lamp or other readily accessible portion thereof.

The generation of the capacitance responsive signal in pulse train form, the comparison of the count thereof with a stored count, the updating of the stored count, the adjustment cf the load driver and the related functions as described above and as more fully hereinafter set forth are all primarily accomplished through digital circuit and logic techniques which offer significant advantages over the prior art systems in which analog circuits and techniques are more extensively used.

DETAILED DESCRIPTION OF THE INVENTION

Figure 1:
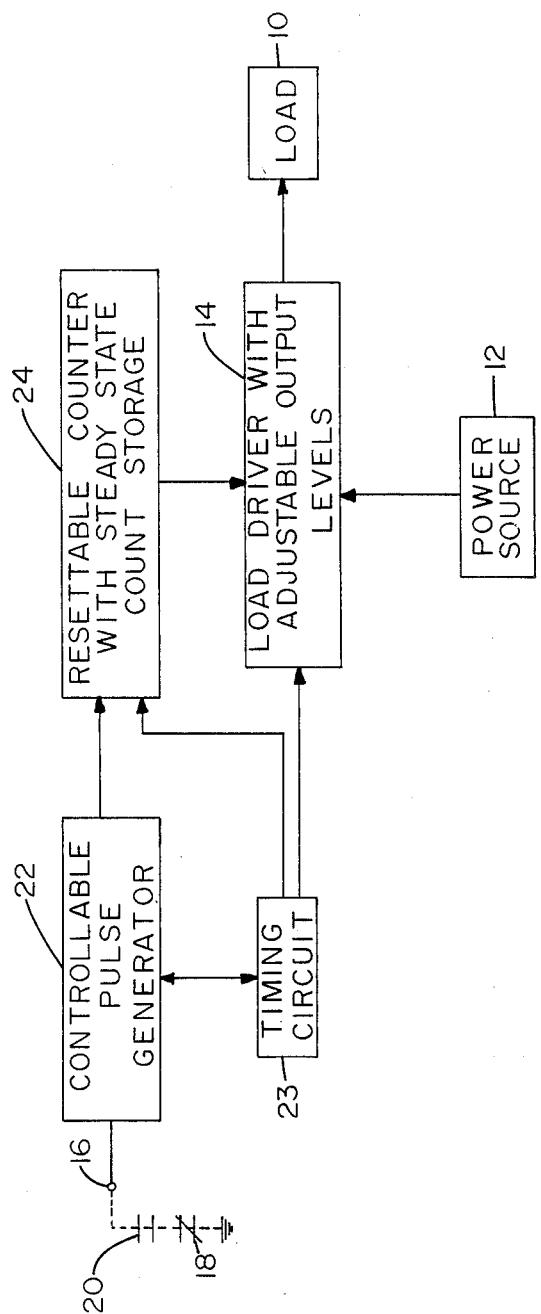
FIG. 1 is a block diagram of one embodiment of the system of the present invention.

FIG. 1 illustrates in block diagram form a preferred embodiment of the present invention. In the system illustrated in FIG. 1, the power delivered to a load 10 from a power source 12 is controlled and regulated by a load driver 14. The power source 12 is typically an AC power source and the load driver 14 is preferably a relatively low loss power control element such as a triac in which the power level is controlled by gating to the "on" condition during greater or smaller portions of each half cycle of the AC source. The load may be of any type where adjustment and control of the power level is desired. The system of the present invention is, however, particularly applicable to household appliances such as lamps.

The power level to the load 10 is controlled in response to a human touch at a control point 16 which causes a change in the input capacitance as illustrated by capacitance 18. The human touch capacitance 18 may be isolated from the input by a series connected isolation capacitance 20. The isolation capacitance 20 may be required if the circuit is operated with its reference connected to the AC line voltage. The magnitude of the isolation capacitance 20 should be very much greater than the magnitude of touch responsive capacitance 18 so that changes in the capacitance seen at the control point 16 will be predominantly a function of changes in the magnitude of the touch sensitive capacitance 18. The embodiment of FIG. 1 operates to adjust the power level from the power source 12 delivered to the load 10 through load driver 14 in response to changes in capacitance 18 caused by a human touch.

A change in capacitance 18 caused by a human touch is converted into a pulse train by a controllable pulse generator 22. The controllable pulse generator 22 produces a series of pulses which, when counted over a selected period of time as determined by a timing circuit 23, indicates the magnitude of the capacitance 18 connected at the control point 16. The relationship between the capacitance at the control point 16 and the number of pulses in the selected period of time need not be linear but should monotonically increase or decrease as a function of the magnitude of the sensed capacitance level. Pulses produced by the controllable pulse generator 22 need not be equally spaced and may be delivered in a burst mode or in any other format in which the capacitance responsive input is encoded in the pulse train.

The output of the controllable pulse generator is delivered to a resettable counter 24 with steady state count storage. The output of the timing circuit 23 is also connected to the resettable counter 24. The resettable counter 24 determines the total count of the pulses delivered from the pulse generator 22 in each preset period of time as determined by the timing circuit 23. The count so determined (the "present count") is compared with a stored count in the resettable counter 24. If the present count is equal to the stored count, no action is taken by the system. If the present count differs from the stored count, the system responds in accordance with several optional modes as will now be described.

In one embodiment, the system may react immediately to the error signal represented by the difference in the present count and the stored count. In another embodiment, the system is activated only if the difference in count persists for a preselected delay or over a preselected number of measurement cycles and if the mismatch remains in the same direction. As will be later explained in greater detail, the latter mode eliminates storage update in response to random noise.

Upon the sensing of a difference between the present count and the stored count, the stored count is incremented or decremented in a direction to bring the two counts closer together and a corrective signal is delivered from the resettable counter 24 to the load driver 14 to adjust the power delivered from the power source 12 to the load 10. In the case of a load driver with a small number of distinct power level settings, for example two to five separate power level settings, a single corrective pulse corresponding to one power level change is produced each time the system is activated by a capacitive change produced by a touch at the control point 16. Where the load driver has a large number of fine settings each corresponding to a relatively small difference in power level from the the next adjacent setting, the corrective response may be to "sweep" continuously through these settings as long as the control signal is applied to the control point 16. The sweep response may be continuous or for a selected time period or for a selected number of cycles. If the count difference persists after the completion of the output pulses, the incrementing or decrementing, as appropriate, of the stored count in the resettable counter 24 is initiated to bring the system to a new steady state condition. When the human touch is removed from the control point, the capacitance 18 is also thereby removed and the stored count in the counter 24 is automatically reset to its original count in a direction opposite to and without corrective output so that the load driver remains in the corrected setting and the stored count is ready for next touch input signal.

Figure 2:
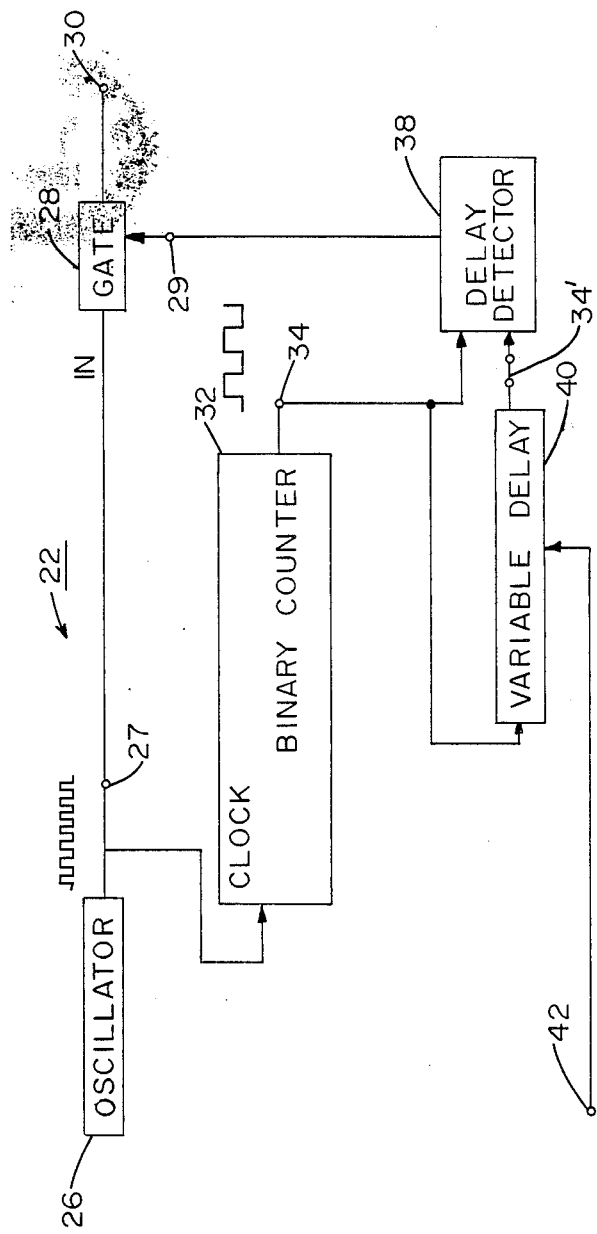
FIG. 2 is a block diagram of the controllable pulse generator function of FIG. 1.

FIG. 2 is a block diagram of a preferred implementation of the controllable pulse generator 22. This subsystem comprises an oscillator 26 which generates a pulse train output at 27 connected to a gate 28. The frequency of the pulse train output 27 is substantially higher than the line frequency of the AC power source and may be of any shape, such as in the form of a square wave as shown, which enables a count to be taken of the number of pulses occurring in a selected time period. The gate 28 is controlled by a control input 29 which switches the gate between "on" and "off" states. The "on" state enables the pulse train at 27 to pass through the gate 28 to a pulse output at 30, while the "off" state blocks the pulse train from passing through the gate so that the output at 30 is zero.

The pulse train output 27 of the oscillator 26 is also connected to the clock input of a binary counter 32. The binary counter 32 is connected as a frequency divider and produces a square wave output which is equal to the input frequency divided by a selected integer. As will be apparent from the wave form analysis later presented, the integer selected for the example presented is eight and the frequency of the square wave is one-eighth the frequency of the oscillator output 27. Of course, the scope of the invention is not in any way limited to the particular values eight or one-eighth.

The square wave output 34 of the counter 32 is supplied as a reference signal to a delay detector 38 which also receives an input signal from a variable delay circuit 40. The square wave output of the counter 32 is also connected to the variable delay circuit 40, which is in turn controlled by a variable delay control signal introduced at 42 from the capacitance control input of the system.

Figure 2A:
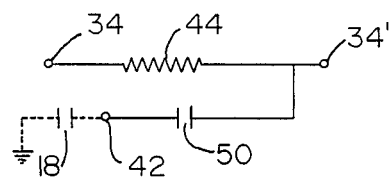
FIG. 2A illustrates one circuit implementation for realizing certain functions shown in the block diagram of FIG. 2.

FIG. 2A illustrates one circuit implementation of the variable delay circuit 40 of FIG. 2. The circuit of FIG. 2A comprises a fixed resistance 44 connected between an input terminal 34 and an output terminal 34'. Connected on the output side of the resistance 44 is a series isolation capacitor 50. As stated above in connection with the description of FIG. 2, the capacitive input signal from the system is connected to the input terminal 42 of the variable delay circuit 40. The touch capacitance introduced by human touch at the control point is represented by capacitor 18 as in FIG. 1.

Figure 2B:
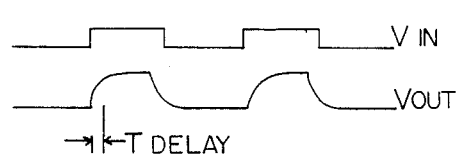
FIG. 2B gives the input and output wave forms for the circuit of FIG. 2A.

The input and output wave forms of the circuit of FIG. 2A are shown in FIG. 2B. The input signal is in the form of a square wave which is the square wave output 34 of the counter 32 of FIG. 2. The output is shifted by the RC time constant of resistance 44 and capacitance 50 with the leading and trailing edges being asymptotically shaped in the form of the RC response curves. The output of the variable delay can be used as is or sharpened into a pure square wave by well known techniques. The important point is that the output is in the general shape of a square wave and is time delayed from the input square wave as a function of the RC time constant of the circuit. Since the magnitude of the resistance 44 is fixed, the RC time constant of the circuit varies as a function of the magnitude of the input capacitance 18 as determined by a human touch at the control point. As previously mentioned, the series isolation capacitance 50 is very much larger than the magnitude of the capacitance 18 and the variation in the total capacitance of the two series connected capacitors 42 and 50 is predominantly a function of the variation in the magnitude of capacitance 18.

Figure 2C:
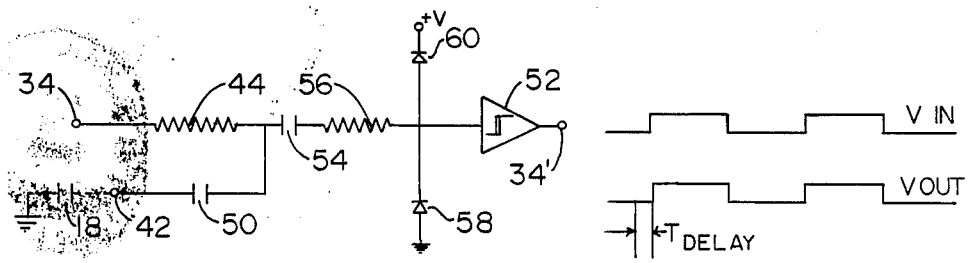
FIG. 2C illustrates another circuit implementation for the circuit function shown in FIG. 2A.

Another circuit implementation of the variable delay circuit 40 of FIG. 2 is shown in FIG. 2C. In this circuit, like numerals are used to identify the like elements as used in FIG. 2A. In addition to these elements, the circuit of FIG. 2B includes a Schmidt trigger 52 having an input capacitor 54, an input resistor 56 and series connected diodes 58 and 60 connected between the DC power supply and ground as shown. Resistor 56 and diodes 58 and 60 provide for ESD protection and capacitor 54 is used to shield the input of the Schmidt trigger 52 from low frequency noise.

Figure 2D:
FIG. 2D gives the input and output wave shapes for the circuit shown in FIG. 2C.

The input and output signals for the circuit of FIG. 2C are shown in FIG. 2D. The input signal is the square wave from the output 34 of the counter 32 as shown in FIG. 2. The output is the output of the Schmidt trigger 52, which is in a first condition before the firing point is reached and goes to a second condition upon firing. Connected as shown in FIG. 2C, Schmidt trigger 52 is fired when the voltage across the series connected capacitors increases to the level of the firing point, the timing of which is in turn determined by the RC time constant of the circuit. The output of the circuit is thus in the form of a square wave 49 time delayed from the input by the magnitude of the RC time constant of the circuit. The magnitude of capacitance 50 is very much larger than the magnitude of capacitance 18 so that variations in the RC time constant formed with resistor 44 are primarily determined by variations in capacitance 18.

Figure 2E:
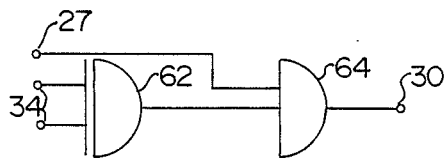
FIGS. 2E and 2F show respectively a logic diagram and related wave shapes for another implementation of one of the functions of FIG. 2.
Figure 2F:
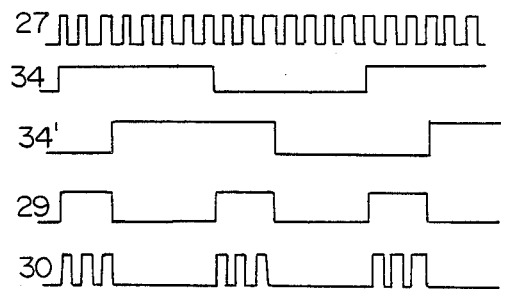
Figure 2G:
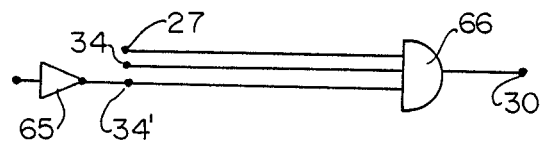
FIGS. 2G and 2H show an alternative logic diagram and wave shapes respectively for realizing the function shown in FIG. 2E.

Implementations of the delay detector 38 and gate 28 of FIG. 2 are shown in the logic diagrams of FIGS. 2E and 2G. The system diagrammed in FIG. 2E includes an exclusive-OR gate 62, which corresponds to the delay detector 38 of FIG. 2. Gate 28 of FIG. 2 is, in this implementation, an AND gate 64. The inputs to the exclusive-OR gate 62 are the square wave output 34 of the counter 32 and the time delayed square wave output 34' of the variable delay 40, both as illustrated in the block diagram of FIG. 2. The time-delayed square wave output of the variable delay 40 is as shown at 34' of the circuit implementations of FIGS. 2A and 2C. The output of the exclusive-OR gate 62 is connected to one input of the AND gate 64, corresponding to control input 29 as shown in FIG. 2, the other input being the pulse train output 27 of the oscillator 26.

Input and output wave forms for the system of FIG. 2E are shown in FIG. 2F, where 27 is the pulse train output of the oscillator 26, 34 is the square wave output of the counter 32, 34' is the time delayed square wave output of the variable delay 40, 29 is the output of the exclusive-OR gate 62 and 30 is the pulse output of the controllable pulse generator of FIG. 2. The exclusive-OR gate 62 is " n" only when either 34 or 34' are present, but not both. Therefore, the exclusive -OR gate 62 is "on" only during the period of the time delay between signal 34 and signal 34' so that the output of the oscillator 26 is gated through AND gate 64 only for the period of the time delay. The number of pulses in the train gated through AND gate 64 in each cycle is therefore determined by the magnitude of the time delay, which is in turn a function of the magnitude of the control point capacitance 18.

Figure 2H:
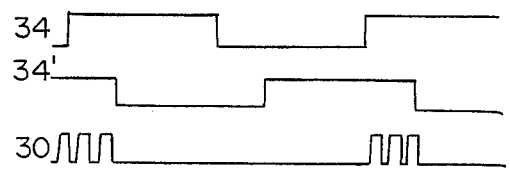

Another implementation for producing a variable number of output pulses in response to a variable delay is shown in FIG. 2G in which an AND gate 66 is utilized. Inputs to the AND gate 66 are the oscillator output 27, the square wave output 34 of the counter 32 and the delayed square wave signal 34', inverted by inverter 65. In this implementation, simultaneous presence of 34 and 34' is required for gating the oscillator signal 27 through gate 66 and the output 30 thereof is as illustrated in FIG. 2H. Thus, AND gate 66 functions both as a delay detector and as a substitute for gate 28. Again, the number of pulses in each cycle is a function of the RC time constant and hence is a function of the magnitude of the control point capacitance 18.

It is noted that the above examples of the variable delay, delay detector, and gate of the pulse generator 22 are illustrative in nature and that numerous other similar implementations of each component will occur to those skilled in the art.

Figure 3:
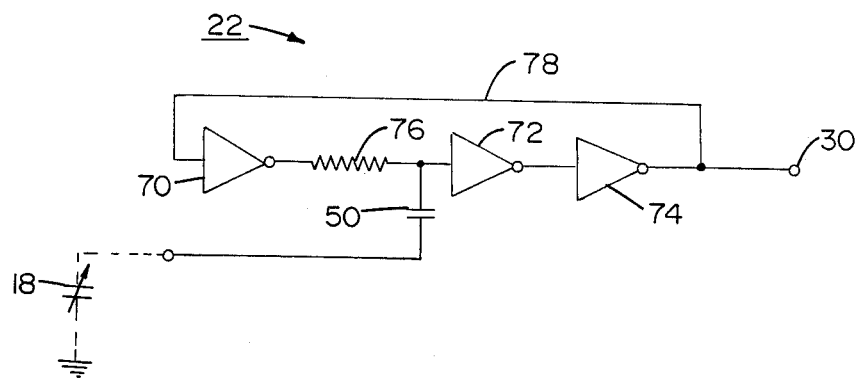
FIGS. 3 and 4 show alternative implementations of the controllable pulse generator function of FIG. 1.
Figure 4:
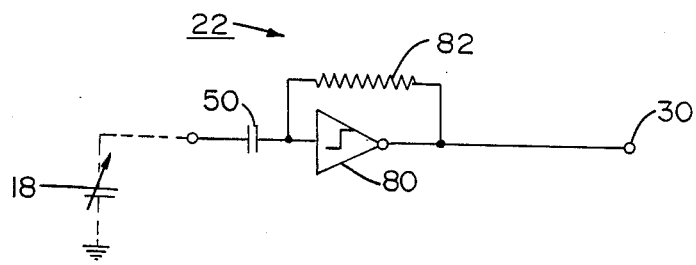

For example, two more simplified embodiments for implementing the control pulse generator 22 are shown in FIGS. 3 and 4. In FIG. 3, inverter gates 70, 72 and 74 are connected in series with resistor 76 and through a feedback loop connection 78. The control point capacitance 18 is connected through isolation capacitance 50 to the input of inverter 72 as shown. The oscillation frequency of the feedback loop formed by inverters 70, 72 and 74 and resistor 76 is a function of the capacitance of the isolation capacitance 50 and the control point capacitance 18. Again, the magnitude of the isolation capacitance 50 is chosen to be very much greater than the magnitude of the control point capacitance 18 so the changes in the connected capacitance are primarily a function of changes in the magnitude of the capacitance 18.

The frequency of oscillation of the loop of FIG. 3 is determined by the rate of build up of the signal at the input to inverter 72 which is in turn determined by the RC time constant of the connected capacitance and the resistance of the resistor 76. Changes in the RC time constant are predominantly a function of magnitude changes in the control point capacitance 18 and the changes in the frequency of output 30 are thus a function of such capacitance magnitude changes.

In the embodiment of FIG. 4, a Schmidt trigger 80 is utilized with a feedback resistor 82, and control point capacitance 18 is connected to the input thereof through series isolation capacitance 50. Frequency of oscillation of the feedback connected Schmidt trigger loop is determined by the RC time constant of resistor 82 and the input capacitance. Since capacitance 50 is very much larger than control point capacitance 18, changes in the frequency of oscillation of the pulse output 30 are thus a function of input capacitance 18.

Figure 5:
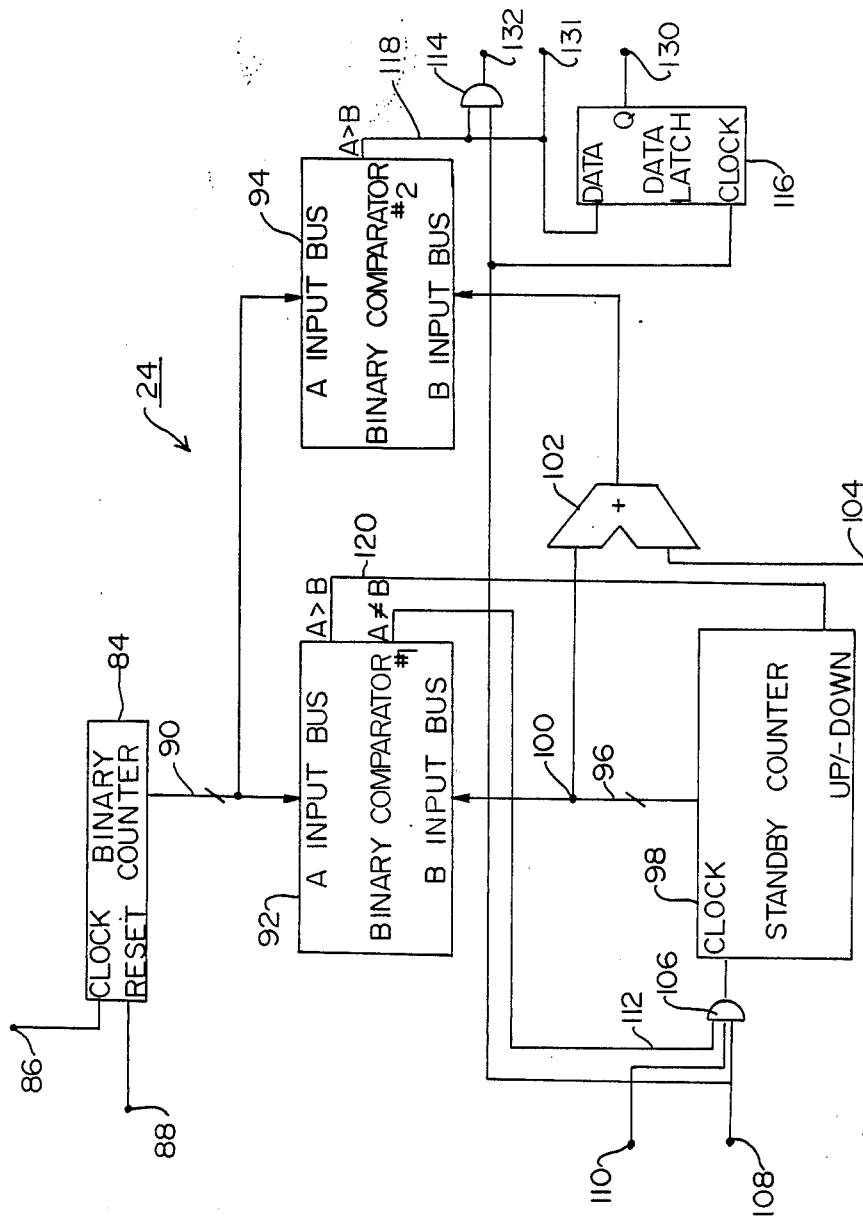
FIG. 5 is a block diagram of the resettable counter with steady state storage function of FIG. 1.

Reference is now made to FIG. 5 which illustrates one implementation of the resettable counter with steady state storage function 24 of FIG. 1. The implementation of FIG. 5 includes a binary counter 84 having a clock input 86 and a timing input 88. The output 90 of the binary counter is connected to the A input buses of binary comparators 92 and 94. The output count bus 96 of a standby counter 98 is connected to the B input bus of binary comparator 92 and also to one input 100 of an adder 102. The other input 104 of adder 102 is connected to a reference count source in which there is stored a selected fixed reference count which may be in the form of a hard wired or read only memory set count representing a threshold count for initiating corrective response of the system, as will later be more fully explained.

The clock input of standby counter 98 is through an AND gate 106 having a timing input 108, an "update enable" input 110 and an "A not equal to B" input signal 112. The timing input signal 108 is also connected to one input of an AND gate 114 and to the clock input of a data latch flip flop 116. The "A greater than B" output 118 of binary comparator 94 is connected as the other input of AND gate 114. The "A greater than B" output 120 of binary comparator 92 is connected to the "up/down" input of standby counter 98.

Binary counter 84 is reset at the conclusion of each measurement cycle and counts pulses coming into a clock input 86 from the controllable pulse generator 22 of FIG. 1. The standby counter 98 stores a steady state count which is used in the analysis of the count made by counter 84 (the "present count") to determine changes in count from cycle to cycle. The difference in the present count of counter 84 and the stored count of standby counter 98 is determined by binary comparator 92. In the embodiment shown, if the count at the input bus 90 of counter 92 is greater than that at its B input bus from line 96, the "A not equal to B" signal input to AND gate 106 is activated and the "A greater than B" signal appears at line 120 connected to the "up/down" control of standby counter 98. Counter 98 is thereby counted forward in the direction to match the present count.

In the example shown, it is assumed that the controllable pulse generator produces an increase in the pulse count each cycle with an increase in the control point capacitance. It should be understood, however, that the system can be implemented with reverse logic to provide for an inverse relationship between the number of pulses in the count and the magnitude of the control capacitance. The remaining logic of the system can be arranged so that the response is either up or down in the corrective count response in accordance with the appropriate polarities of operation which are selected.

In the example shown in FIG. 5, the corrective count is forward and the incremented count of counter 98 is connected through input 100 of adder 102, which adds the fixed reference count to the incremented count, and the total is applied to the B input bus of binary comparator 94. For the example given, where the sensed count of counter 84 is greater than the stored count of counter 98, if the sensed count which appears at the A input bus of comparator 94 is also greater than the stored count plus the reference count appearing at the B input bus of comparator 94, an "A greater than B" signal appears at the output 118 of comparator 94 to change the setting of the load driver. If the present count does not exceed the stored count by at least the amount of the reference count, no signal appears at the output 118 of comparator 94 and no corrective action is taken by the system. The reference count thus provides a threshold for the operation of the system and prevents unwanted response to noise and other random low level signals.

The output of comparator 94 is connected to the AND Gate 114 and to the data input of flip flop 116 to provide two different output signals which can be selected for different modes of operation of the system. In addition, the output of comparator 94 may be directly utilized as indicated by line 131. The Q output 130 of data latch flip flop 116 goes positive once for each application of the control signal and is intended primarily for a load driver with a small number of power setting states, such as for example two to five states. The application of the control signal output of flip flop 116 would in each case advance the load driver setting from one state to the next. One of these states would be the power off setting.

The output 132 through the AND gate 114 gives a sequence of pulses as long as the present count exceeds the stored count plus the reference count. This output can be used to drive a sweep circuit for a load driver with a large number of distinct states. Or, if the rate of the pulses is kept low, even a small number of states can be swept. This allows the application of the control signal to act as the on/off switch, and the prolonged application of the control signal to act as a means for raising or lowering the power level to the load.

The updating of the stored count in counter 98 is controlled by the use of the update enable input 110 of the AND gate 106. If the update enable signal is not present at the input 110 of the AND ate 106 the gate 106 remains off and updating of the stored count is thereby prevented. Control of this signal is used, for example, to set a time delay in the response of the system to prevent response to noise or other random short time duration inputs. In this embodiment, application of the update enable signal is delayed for a selected time period or for a selected number of consecutive cycles showing a difference in the present count and the stored count.

When the touch input signal is removed the input capacitance 18 at the control point input is also thereby removed and the present count goes back to its original steady state value. The stored count in standby counter 98 is also thereby reset to its original steady state condition. The system polarities are selected such that there is no corrective response to the reset count of standby counter 98 so that the load driver remains in the condition as set by the previous touch input.

Figure 6:
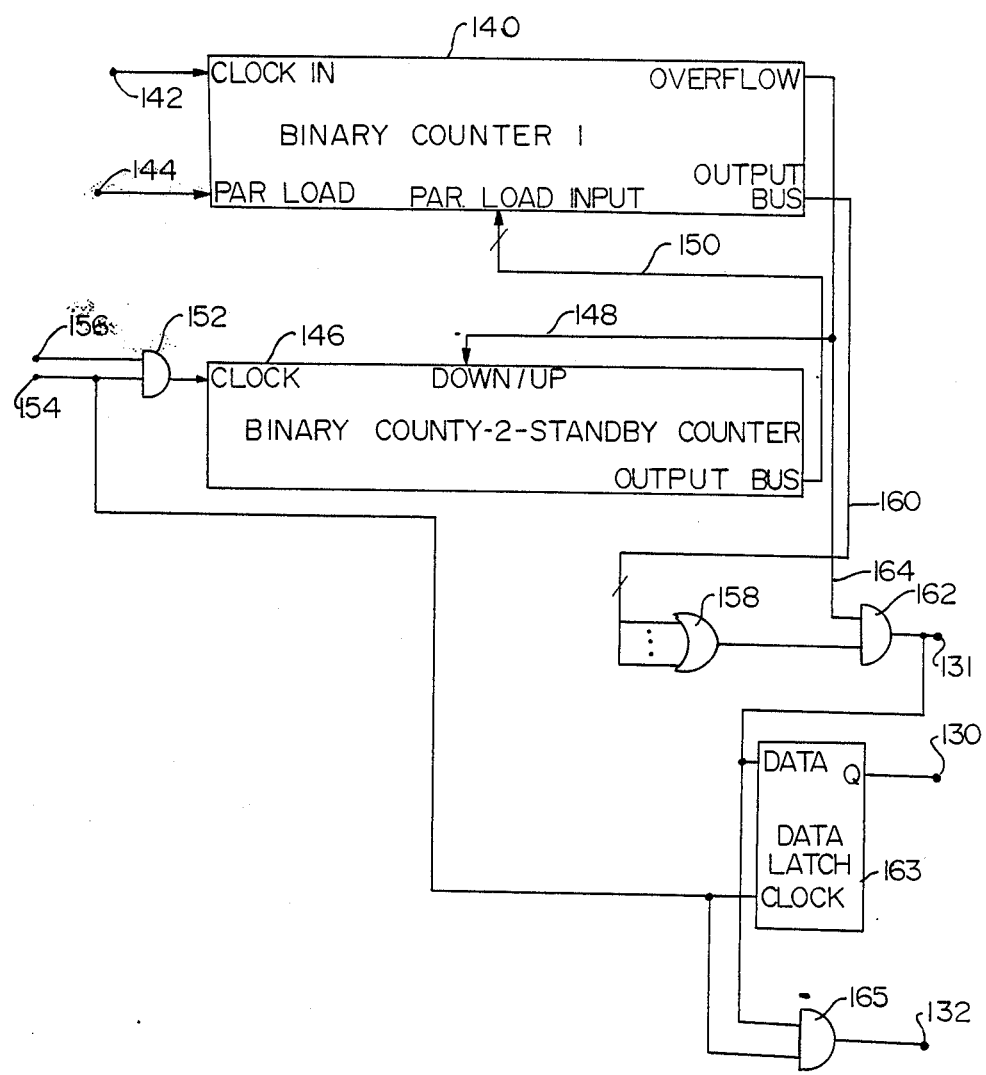
FIG. 6 is a block diagram of an alternative embodiment of the resettable counter of FIG. 5.

Another implementation of the resettable counter with steady state count storage is shown in FIG. 6. In this implementation, a binary counter 140 is used to keep track of the present count from an input 142 and a timing signal input 144. In this case, the counter 140 is reset at the end of each timing period. However, this reset does not force all stages to zero but forces the contents of the steady state counter into it as will now be explained.

The embodiment of FIG. 6 includes a binary standby counter 146 having a down/up input connected through line 148 to the overflow output of counter 140 and an output bus connected through line 150 to the parallel load input of counter 140. The clock input of counter 146 is controlled by an AND gate 152 having inputs of a timing signal 154 and an update enable signal 156. The timing input is from the main timing circuit of the system and the update enable performs the same function as described above in connection with FIG. 5. In this embodiment, the reset is replaced with parallel load of counter 140 from the standby counter 146.

The steady state of standby counter 146 is achieved by counting up as long as counter 140 does not overflow and by counting down if counter 140 does overflow. In this manner, the steady state is defined as the condition that forces the present count to be at the maximum of counter 140. In other words, the sum of the contents of counter 146 plus the count of the number of pulses from the controllable pulse generator in steady state forces counter 140 to go to its maximum count. If there is a change in the capacitance at the control point after this steady state condition is achieved, thereby increasing the number of pulses coming from the controllable pulse generator, counter 140 overflows and the overflow represents the count associated with the change in the control capacitance. Sensing of this change in the control capacitance can be made to detect a large change in capacitance associated with a true signal by observing the higher order bits after an overflow. As shown in FIG. 6, this is accomplished by means of an OR gate 158 connected through line 160 to the overflow output of counter 140 to sense the presence of selected higher order bits to drive the output circuitry to generate the outputs as described in connection with FIG. 5.

This output circuitry includes the same types of elements as used in the embodiment of FIG. 5, namely an AND gate 162 having as inputs the data overflow of counter 140 through line 164 and the output of the OR gate 158, and a data latch flip flop 163 with the data input connected to the output of gate 162 and the clock connected to the timing circuit line 154. The output of AND gate 162 is input to AND gate 165 whose other input is connected to timing circuit line 154 in order to permit sweeps as was discussed above in connection with AND gate 114 and FIG. 5. The output of AND gate 165 is a sequence of pulses continuing as long as the overflow from counter 140 is present. The output of data latch 163 is positive once for each time the control input signal is applied. Uses for these different types of signals are set forth above in the description of the embodiment of FIG. 5.

Figure 7:
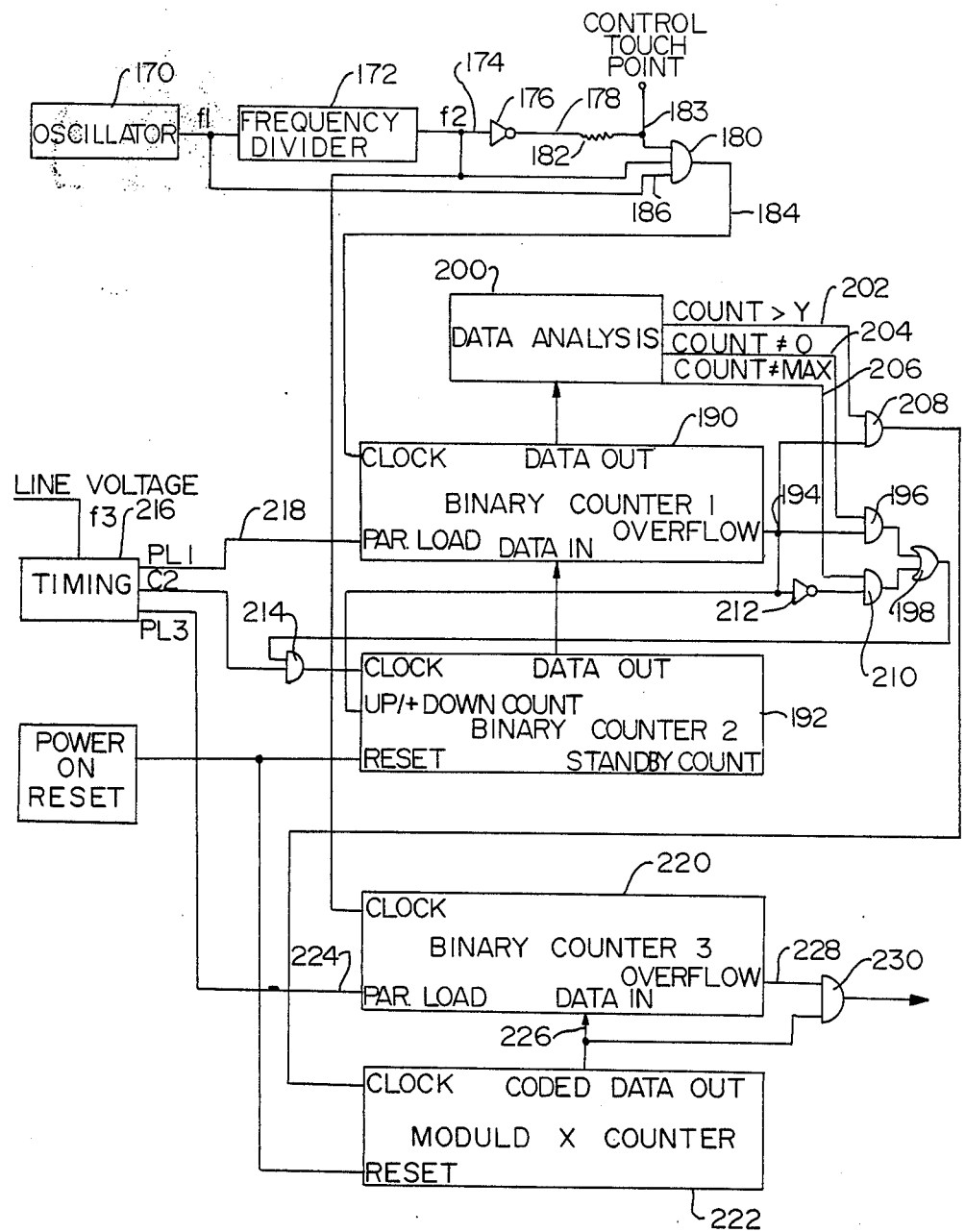
FIG. 7 is a block diagram of one implementation of the power control function of the system of FIG. 1.

FIG. 7 is a block diagram of a complete system interconnection utilizing some of the alternative implementations described above to form a complete power control system. This embodiment comprises an oscillator 170 connected to a frequency divider counter 172 which produces a low frequency square wave at its output and is in turn connected to an inverter 176, the output 178 of which is connected to one input 183 of an AND gate 180 through a resistor 182. Also connected to input 183 of AND gate 180 is the control touch point with touch capacitance 18 being connected through series isolation capacitance 20.

It will be noted that in the system of FIG. 7, the square wave output 174 is connected to one input of the AND gate 180 and the inverted square signal thereof 178 is connected through resistor 182 to another input 183 of the AND gate 180. Therefore, if the direct and inverted signals of the square wave 174 are exactly opposite each other in phase, the AND gate 180 will never be turned on. However, the square wave applied at input 183 is time shifted by the RC time constant of the resistor 182 and the input control capacitance so that the oscillator signal at input 186 is gated through the AND gate 180 during intervals of the mismatch between the square wave and its inverted signal in the same manner as signals 34, 34′, and 30 are gated through AND gate 66 as shown in FIGS. 2G and 2H. The number of pulses from the oscillator 170 passing through the and gate 180 during each timing cycle is therefore a function of the input capacitance at the control point at input 183.

The controlled pulse signal at line 184 is connected to the clock input of a binary counter 190, which is similar in operation to binary counter 140 of FIG. 6. A standby binary counter 192 is connected to the parallel load data input of counter 190 and counts up as long as counter 190 does not overflow. When counter 190 does overflow, counter 192 counts down so that an equilibrium or steady state is reached when the counter 190 is at its maximum count. Any additional count from line 184 caused by a change in the capacitance at the control point therefore causes counter 190 to overflow. Overflow output 194 of counter 190 is connected to the up/down count of counter 192 to control the count of counter 192 in achieving the steady state match. The overflow output 194 is also connected to one input of AND gate 196, the output of which is connected to one input of OR gate 198.

A data analyser 200 analyses the count of counter 190 and provides an output at 202 if the count is greater than a selected count Y, an output at 204 if the count is not equal to zero and an output at 206 if the count is not equal to the maximum count. Output 202 is connected to an input of an AND gate 208, output 204 is connected to an input of AND gate 196 and output 206 is connected to an input of an AND gate 210. The other input of and gate 210 is connected to overflow output 194 of counter 190 through an inverter 212.

The output of OR gate 198 is connected to an input of AND qate 214, the other input of which is from timing circuit 216. AND gate 214 controls the clock input of timer 192. It will be apparent from analysis of the logic sequence of the elements just described that one input of AND gate 214 is enabled from the output of OR gate 198 when either signal 194 is in overflow and the count is not equal to zero (AND gate 196) or signal 194 is not in overflow and the count is not equal to the maximum (AND gate 210). The clock of counter 192 is thus controlled by the combination of the signal just described and the signal from timing circuit 216 at the other input 216 of AND gate 214. Activation of the parallel load function of counter 190 at the end of each timing cycle is made by a signal 218 from the timing circuit 216. The counter 190 is adjusted to overflow or maximum count in the steady state through the functions just described in the same manner as the counter 140 of FIG. 6. Any additional count caused by a change in the capacitance at the touch control point will thus cause overflow to activate the system in the manner now to be described.

Control of the load driver is accomplished through a pair of counters 220 and 222. Counter 220 is a binary counter of the same type as counter 190 with a parallel load data input capability through lines 226 and an overflow output at 228. Counter 222 is a Modulo X counter where X is a selected integer. The clock of counter 222 in controlled by the output of AND gate 208 which is enabled by the overflow signal 194 and the output 202 of data analyzer 200 when the count is greater than the selected count Y. The clock of the counter 220 is connected to the square wave output 174 of the counter 172. The load driver (14 in FIG. 1) is triggered by an AND gate 230 in response to overflow at 228 of counter 220 and the coded data output signal of Modulo X counter 222.

Counter 220 is therefore used to turn on the load driver 14. This is done every half cycle of the AC power line input. To accomplish this load driver triggering, a fixed frequency wave form is used as the clock to counter 220. At the beginning of every half cycle, counter 220 is loaded with a count as determined by the contents of Modulo X counter 222.

After the starting count is loaded in, the fixed frequency clock forces counter 220 to count up. As soon as the count produces an overflow condition, the load driver 14 is turned on. Since the overflow produces the load driver turn-on, the loading of a small count into counter 220 at the beginning of the half cycle turns the driver on late in the half cycle. Since the driver turns off at the end of every half cycle, the loading of a small count is equivalent to a low power transfer into the load. If the counter 220 is preloaded with a large count, then the overflow condition is reached early in the half cycle, effectively producing a large transfer of power to the load.

One of the X states of the Modulo X counter 222 is normally assigned the off state. It will be recognized, however, that the off state., while desirable, is not necessary. The count loaded for this off state is not important since the decoding for this state inhibits AND ate 230. Each of the remaining X-1 states can be assigned a unique power level in any order desired. These power levels can then be used to calculate the time within the half cycle Ton to turn on the driver 14. Using this information and the knowledge of the input clock cycle time Tin as well as the total count in counter 220 necessary to produce an overflow, the preload count for each state can be calculated as:

Preload count=Overflow count−Ton/Tin.

Counter 220 may be a straight counter with parallel load capability or, alternatively, it can be implemented just like counter A of FIG. 8, to be described below.

Figure 8:
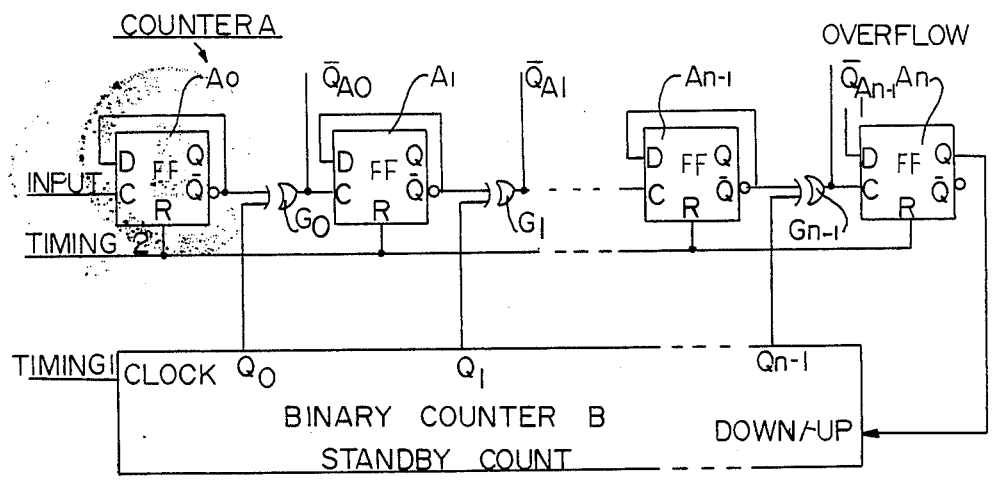
FIG. 8 is a logic block diagram of the counter interface of the system of FIG. 1.

FIG. 8 is an efficient implementation of two binary counters for the resettable counter with steady state count storage shown at 24 in FIG. 1. In this implementation, counter A comprises a series of flip flops designated A0, A1 . . . through An with an overflow output at $A_n$ connected to the down/up input of counter B. Binary counter B has stage outputs Q0, Q1 . . . through Qn each of which is connected to a corresponding stage of counter A through an exclusive-OR gate G0, G1 . . . $G_{n-1}$ as shown. In the implementation shown here, instead of loading counter A at the start of each new count cycle, each latch stage is reset and connected to the exclusive-OR gate which, together with the inputs from counter B, produces an effect identical to the parallel load. This effect can be better understood by noting the forward movement of the first positive transition as the count for binary counter B goes from 00 to 11.

Figure 9:
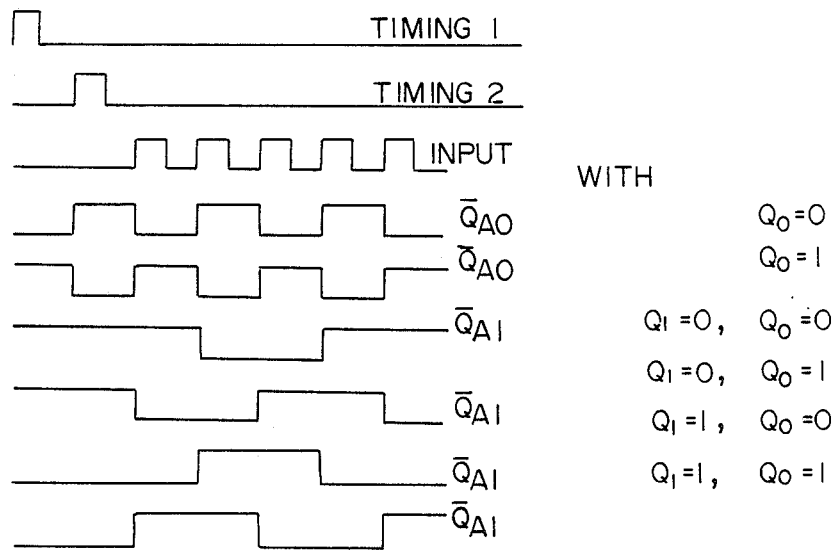
FIGS. 9, 10, 11 and 12 are counter logic diagrams illustrating certain delay and other functions of the system.

The length of counter A is determined by the expected maximum count for the worst case sense capacitance. Counter B is normally of the same length, although some of the lowest order bits may be dropped with no adverse effect. A large counter may require an extended period of time to reach steady state after power on or after change of external conditions. To speed up this updating, the two counters can be divided into segments as shown in FIG. 9. With this approach, the condition of all zeros with an overflow or all ones with no overflow at the end of the count cycle in counter A represents the steady state.

Figure 10:
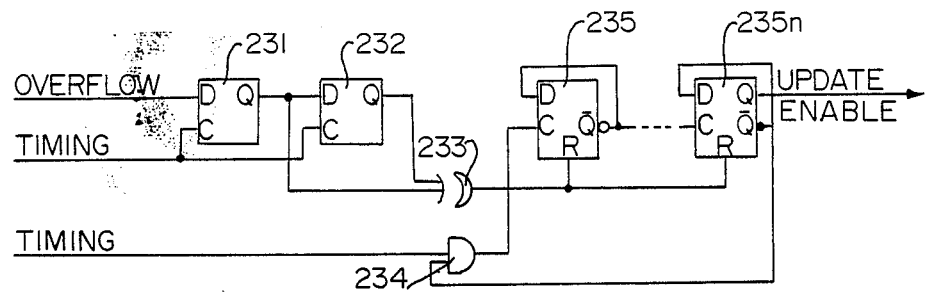
Figure 11:
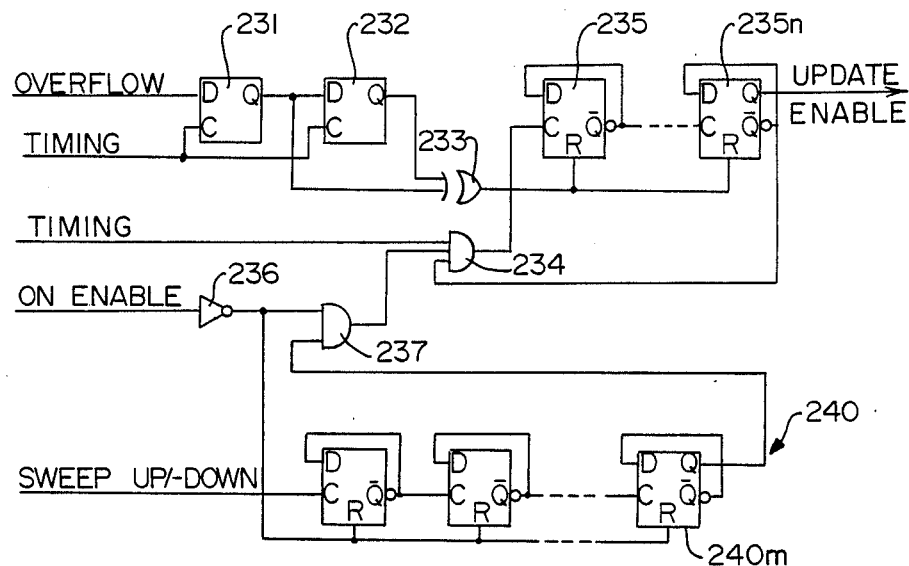

FIG. 10 shows one method of preventing updates until the error or request signal remains in effect for a selected number of cycles. In this embodiment, the overflow output and timing signals are connected to flip flops 231 and 232 through an exclusive-OR gate 233 and an AND gate 234 to a serial counter having stages 235 to 235n such that the output may be connected to the update enable input 156 in FIG. 6. This produces a delay in the update enable signal for a selected number of cycles and eliminates response to short bursts of random noise and other random signals of short time duration. FIG. 11 illustrates a modification of FIG. 10 in which updating is further prevented until $2^m$ cycles of power sweep have been completed. In this embodiment, the on enable signal is connected through an inverter 236 and an OR gate 237 to the AND gate 234. The other input to the OR gate 237 is the output of the m stage 240 m of a counter 240.

Figure 12:
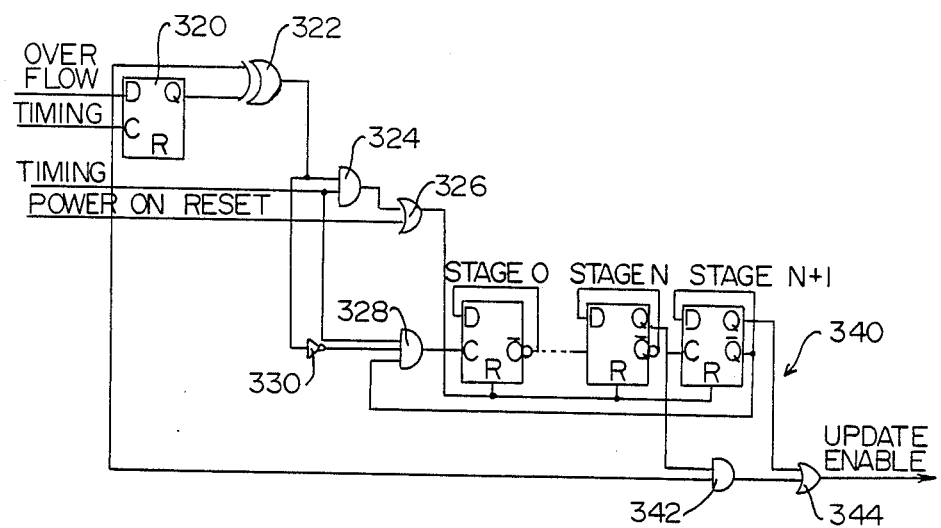

Another embodiment shown in FIG. 12 allows unsymmetrical updating delay. This is especially useful where repeated applications of control signal can occur. If a symmetrical update is used, it is possible for the standby counter to 'drift' to a point where the sensitivity of the control could be lost. The unsymmetrical delay allows a faster recovery when the control capacitance is removed, and also a slow correction for increasing capacitance. In this embodiment, the overflow and timing signals are connected through a flip flop 320 to an exclusive-OR gate 322. The timing signal is also connected to an AND gate 324, the output of which is connected to one input of an OR gate 326, the other input of AND gate 326 being the power-on reset signal. The output of exclusive-OR gate 322 is also connected to one input of an AND gate 328 through an inverter gate 330, the other inputs to the AND gate 328 being the timing signal and the feedback connection from the last stage of a counter 340. The overflow signal and the output of the nth stage of counter 340 are connected to an AND gate 342. The output of AND gate 342 and the output of the n+1 stage of counter 340 are connected through an OR gate 344 to generate the update enable signal.

Figure 13:
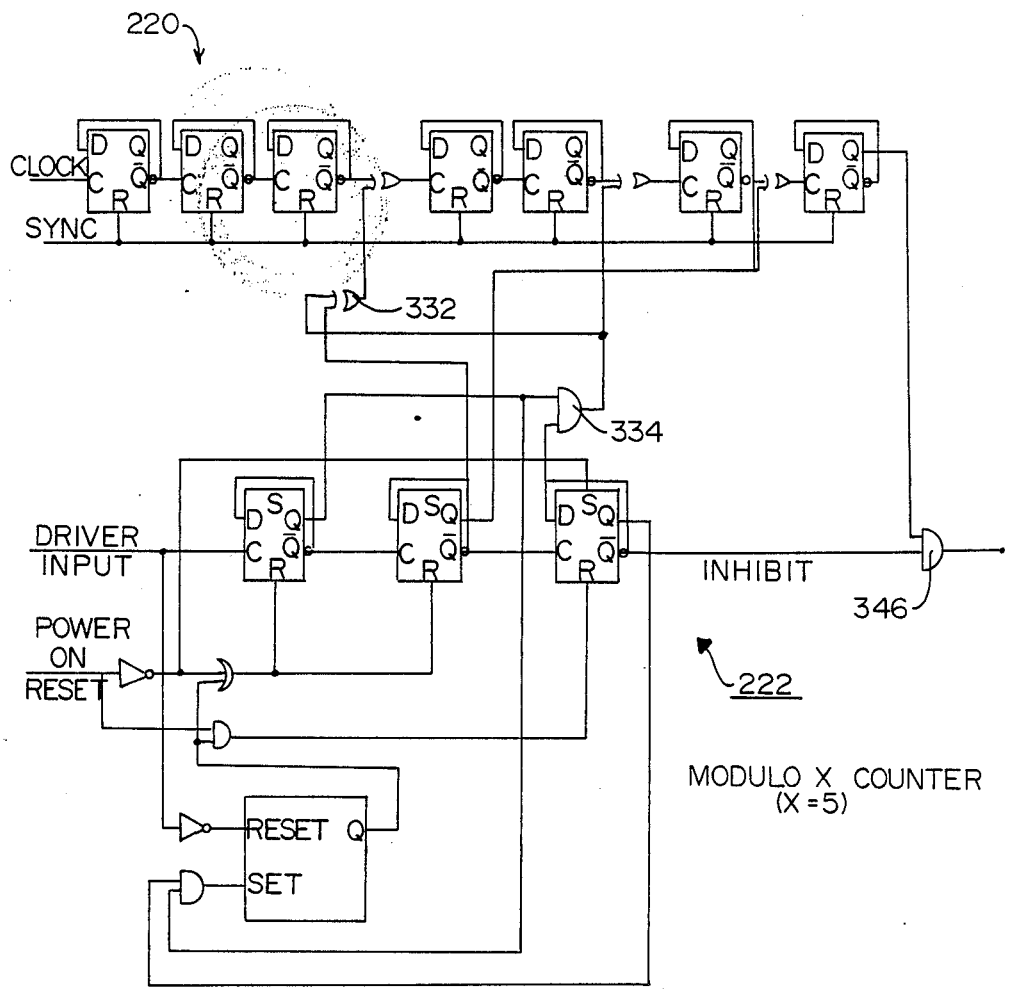
FIGS. 13 and 14 are logic diagrams of certain counter interface functions of the system.

The distinct output levels of the load driver can be achieved as shown in FIG. 13. This is accomplished by using two counters, i.e. a counter 220 and a Modulo X counter 222 (where X=5 for the case shown). Counter 220 is designed to switch the final stage, when driven by a fixed frequency, toward the end of the power cycle, if it starts out with all stages reset to zero at the beginning of the power cycle. If, however, at the beginning of the power cycle counter 220 is loaded with a non-zero count, this positive transition of the final stage can be moved up closer to the start of the power cycle. As discussed above in the case of counters 140 and 146 and their counterparts in the other embodiments, it is possible to replace the parallel load operation with exclusive-OR coupling between counter stages as shown in counter 220 in FIG. 13. In either case, the control of counter 220 is achieved by the contents of Modulo X counter 222. In this case X is the number of distinct states for the load driver.

If the length of the counter 220 is larger than Modulo X counter 222, then the outputs of counter 222 are coded before application of the signals to counter 220, for example by exclusive-OR gate 332 and AND gate 334. In this case only a few of the stage interconnections require exclusive-OR gates.

The desired load switching time determines the type of coding to be used. The output of counter 220 is then used to drive an output stage, which can be a triac, but not restricted thereto. The output is connected through an AND gate 346 with the other input being the inhibit signal from counter 222. For the circuit shown in FIG. 13, X is five, with one of those states being off.

Figure 14:
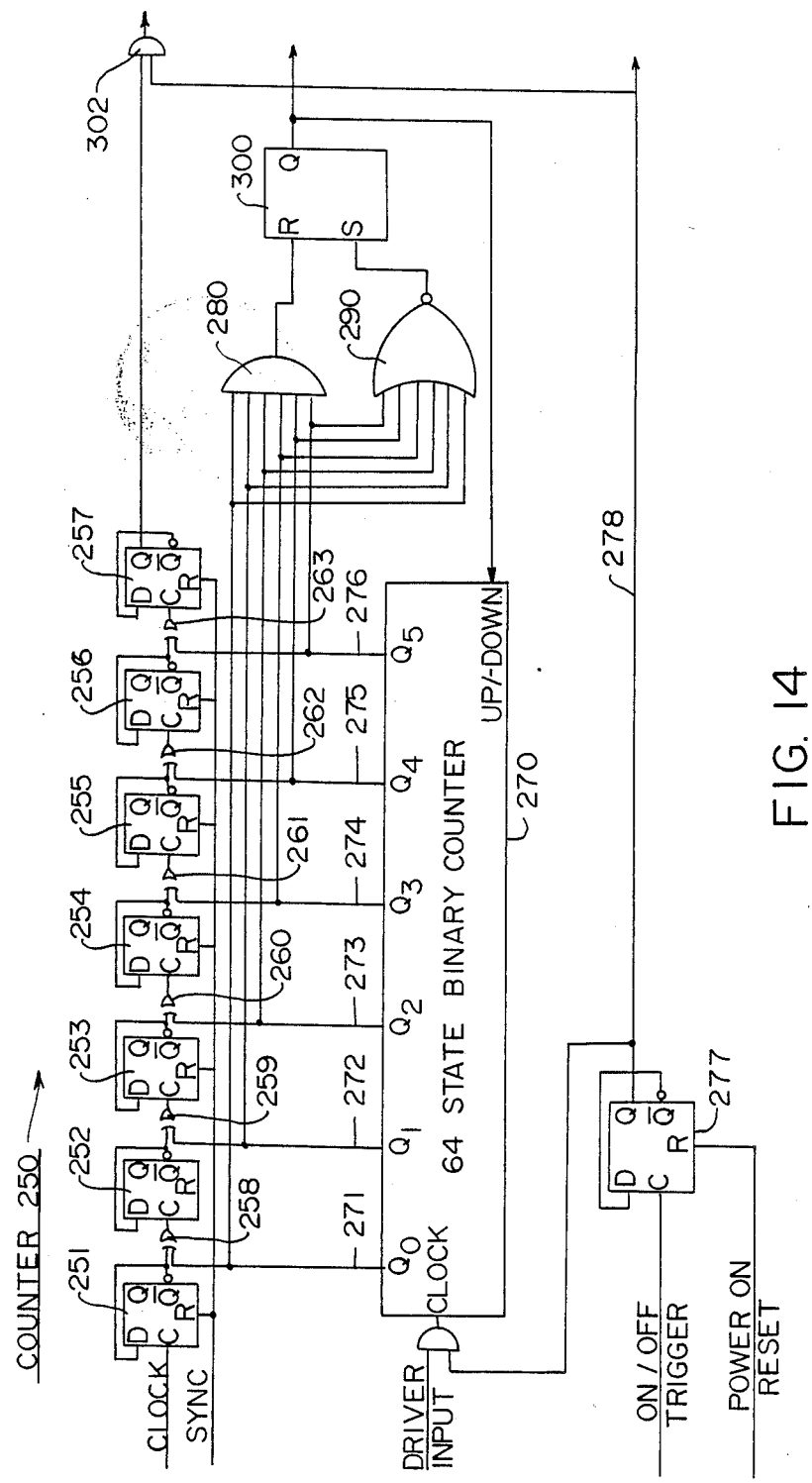

FIG. 14 illustrates a simple version of a sixty four power level load driver. This control allows the power level to sweep up to the maximum and then return to the lowest level. The system comprises a counter 250 which includes a series of flip flops 251 through 257 interconnected by exclusive-OR gates 258 through 263. A second counter 270 is, for the example shown, a sixty four state binary counter having stage outputs 271 through 276 connected to exclusive-OR gates 258 through 263 and to AND gate 280 and OR gate 290 as shown. The outputs of gates 280 and 290 are respectively connected to the reset and set inputs of a flip flop 300, the Q output of which is connected the up/down input of the second counter 270 to "sweep" counter 250 through its respective stages. An on/off latch 277 generates an on enable signal in line 278 except when latch 277 is reset during a power on cycle. Reset of flip flop 300 occurs when outputs $Q_0$ to $Q_5$ of counter 270 are all high, i.e., when a binary 63 is output by the counter (the 64th state is 0).

Figure 15:
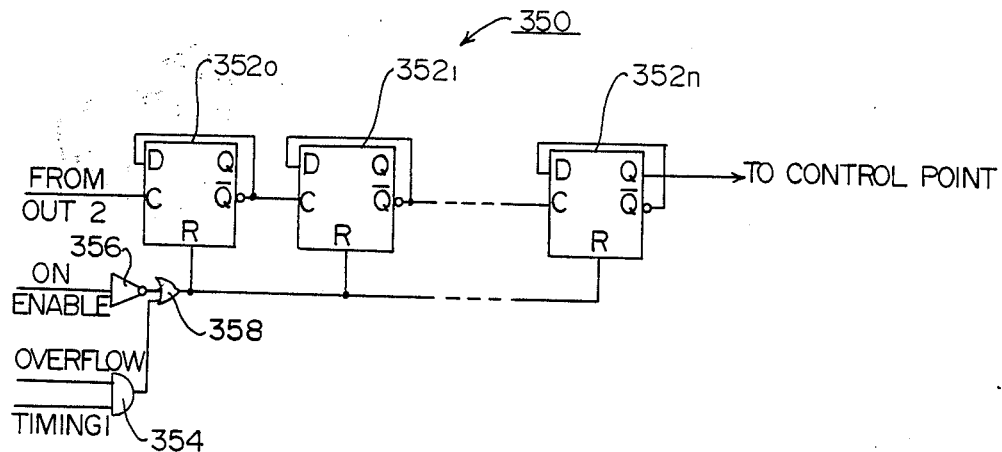
FIGS. 15 and 16 are logic diagrams of embodiments of the sweep rate control and delay functions of the system.
Figure 16:
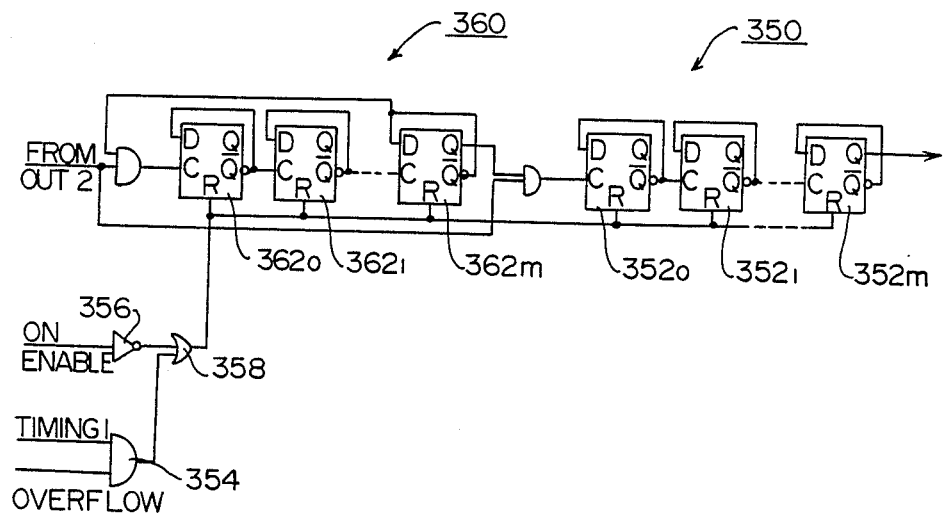

Implementation for sweep rate control with initial delay are shown in FIGS. 15 and 16. In these embodiments, the load driver input is connected to the sweep output of the resettable counter, such as output 132 of FIG. 5, through sweep rate controls as illustrated. This connection is made in The implementation of FIG. 15 through a binary counter sweep rate control 350 comprising serially connected flip flops having stages 352 through 352n. Overflow and timing signals are connected through an AND gate 354 and the on enable signal through an inverter 356 and an OR gate 358. The output of stage 352n of the counter 350 is connected to the input of the load driver. In the embodiment of FIG. 16, initial delay is provided through binary counter 360 having stages $362_0$ to $362_m$.

Figure 17:
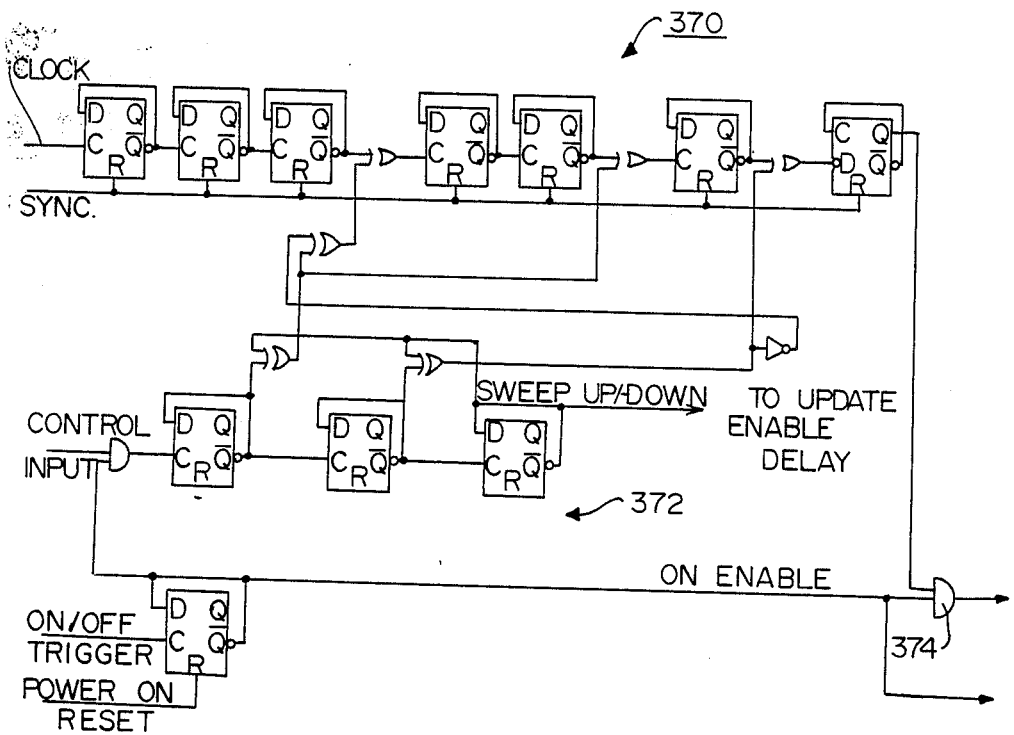
FIG. 17 is logic diagram of another counter interface.

FIG. 17 shows a modification of FIG. 13 to the on/off and sweep mode. In this embodiment, 370 is a binary counter with interstage exclusive-OR gates as shown for replacing the parallel load function as explained earlier. Counter 370 interfaces with a Modulo X (x=5) counter 372. Inputs to the system are as labeled. The output is through an AND gate 374 to the load driver. The advantage of this embodiment is that it is possible to turn the load on and off at the same power level without the need for going through all power levels. For instance, if this embodiment is used for light control, and the light is set for "night light" level, it is possible to turn it off without going through the highest light level.

Figure 18:
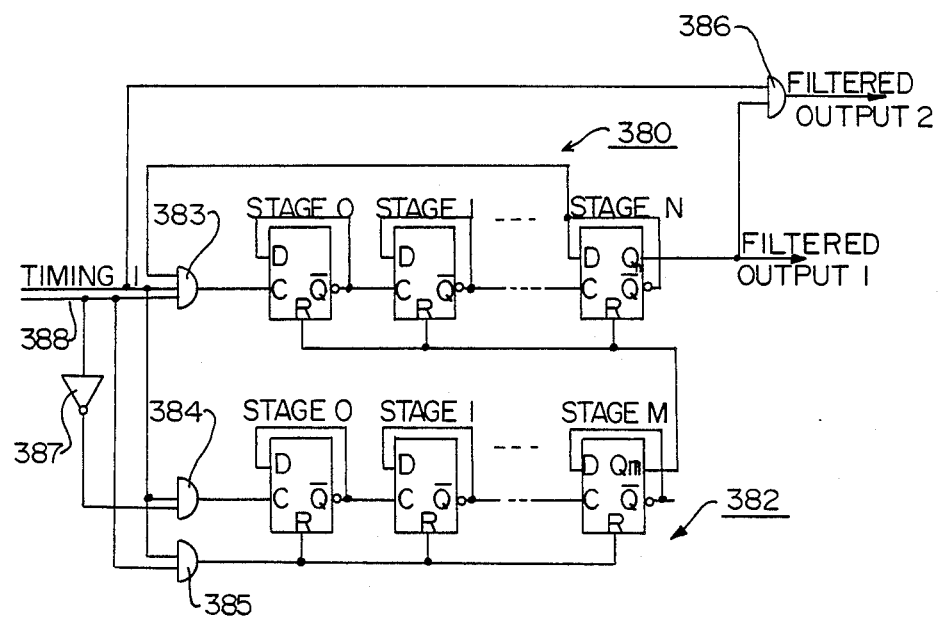
FIG. 18 is a logic diagram of another embodiment of the resettable counter function including provisions for reducing response to noise.

FIG. 18 shows an embodiment for eliminating response to a short burst of noise that lasts less than a selected number of cycles. In this embodiment, an n stage counter 380 is connected as shown with an m stage counter 382. Timing input and the input from the resettable counter are as shown. This arrangement also eliminates multiple switching if the noise drops out control for less than $2^M$ cycles.

A positive signal from the resettable counter on line 388 indicates a resettable counter overflow condition, which under normal conditions is an indication of a human touch at the control point as shown in FIG. 1. However, under conditions of noise, a false overflow condition might be indicated by a spurious signal on the output line from the resettable counter. The embodiment of FIG. 18 uses counters 382 and 380 to distinguish between a true signal and a short noise pulse.

Counter 382 acts as a reset for counter 380. When counter 380 is reset, the output $Q_n$ is high. This occurs when the $Q_m$ output from the resettable counter becomes high, allowing AND gate 383 to pass the "timing 1" signal to clock counter 380. At the same time, gate 385 will reset counter 382. If line 388 remains up for $2^N$ cycles of "timing 1", the output of the Nth flip flop will come up and open up AND gate 386 via "filtered output 1" to allow the timing pulse to pass. However, if the positive signal on line 388 is due to noise which lasts for less than $2^N$ cycles, then the drop of this input stops the clocking of counter 380. Inverter 387 then causes AND gate 384 to pass the timing signal to counter 382, which after $2^N$ pulses will reset counter 380.

In the case of a true signal up level of greater than $2^N$ cycles with some negative noise mixed in, then the noise will have to last for more than $2^M$ cycles to reset counter 380 and possibly cause double switching of the filtered outputs. If M is chosen to be suitably high, then the likelihood of double switching due to negative noise will consequently be minimized.

However, when using the output of AND gate 386 ("filtered output 2") to sweep over a large number of power states, the number of stages M in counter 382 should be kept relatively small so that the output to AND gate 386 is reset soon after the touch signal is removed.

Figure 19:
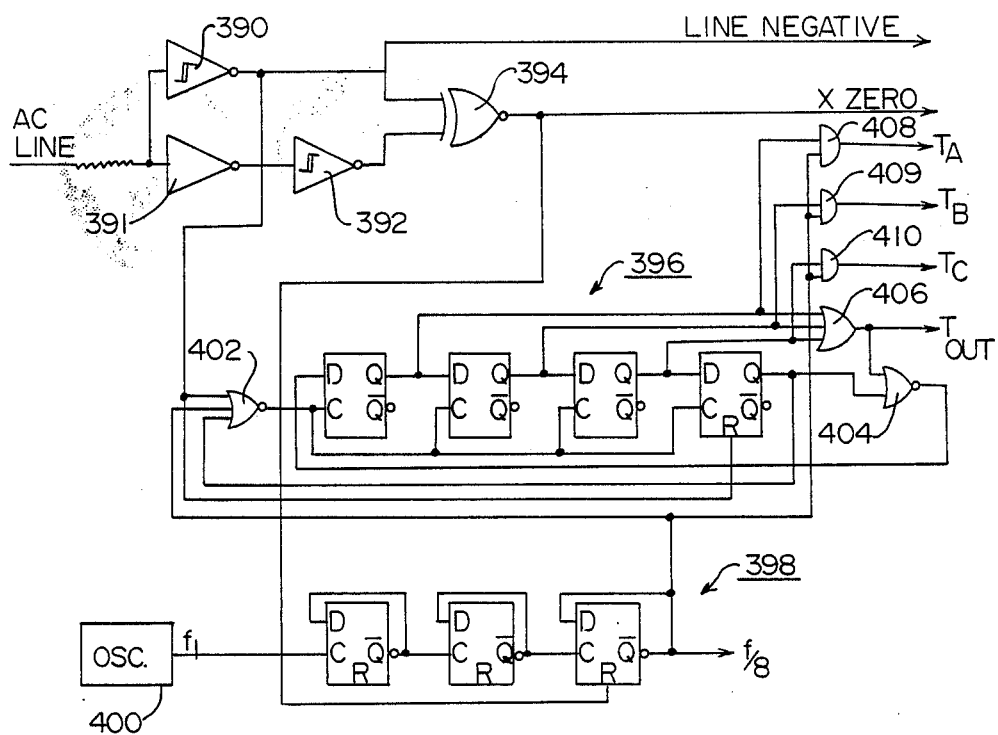
FIG. 19 is a logic diagram of another embodiment for implementing the timing function.
Figure 19A:
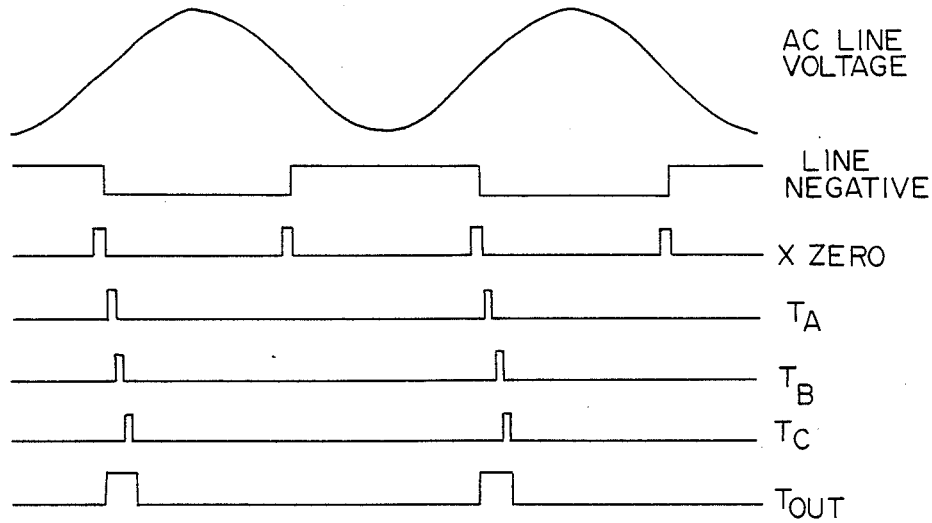
FIG. 19A illustrates the operation of the circuit of FIG. 19.

FIG. 19 illustrates a method for generating the necessary timing pulses. In this arrangement, line voltage is connected through a Schmidt trigger 390 and an inverter 391 through a second Schmidt trigger 392 to an exclusive-OR gate 394. Connections are made as shown between shift register 396, a binary counter 398, an oscillator 400 and an inverted OR gate 402. Feedback from the last output of shift register 396 is made through an inverted or gate 404. Tout is through an OR gate 406 and outputs Ta,Tb and Tc are through AND gates 408, 409 and 410. Wave forms for the line voltage, the oscillator 400 and the outputs Tout, Ta, Tb and Tc are shown in FIG. 19A.

In normal operation, the negative half cycle of the line voltage, through gate 390, inhibits gate 402 which acts as the clock input to the shift register 396. The negative half cycle of the line voltage also resets the final stage of shift register 396. This causes the output from NOR gate 404 to be high. When the line voltage goes positive, inverting Schmidt trigger 390 opens up NOR gate 402 and removes the reset on the last stage of shift register 396. With gate 402 open and the output of gate 404 high, a positive signal is clocked into the first stage of shift register 396. This permits a frequency divided pulse from oscillator 400 to pass through gate 408. At the same time, the positive signal level in one of the shift register stages forces Tout to become high and forces the output of gate 404 low.

Of course, counter 398 is needed only if the oscillator 400 output frequency is too high to produce proper length output pulses at gates 408, 409, and 410. On the next cycle, a low level is clocked into the first stage and the high level is passed to the second stage, which opens up gate 409 to produce the seoond timing pulse. On the next cycle, a low level is again clocked into the first and second stages and a high level is passed on to stage 3 which opens up gate 410 and produces the third timing pulse.

On the next half cycle, a low level is clocked into stages 1, 2, and 3, while the high level is passed on to the fourth stage. This high level inhibits gate 402 and stops all timing pulses until the line voltage again goes negative and resets the shift register through the reset input of stage 4 to start up operation on the next positive half cycle.

The preferred embodiments of this invention are illustrated and described herein for purposes of making a full disclosure of such embodiments and are not intended in any way as limiting. Variations, modifications and substitutions in such embodiments falling within the true scope and spirit of this invention will occur to those skilled in the art. Therefore, it will be understood that this invention is not in any way limited to the embodiments disclosed herein and that the scope and breadth of this invention shall be determined from the claims which follow.

What is claimed is:

1. A touch responsive power control system comprising:
    circuit means having a control input producing a capacitive change responsive to human touch;
    means responsive to said capacitive change for generating a digital pulse train, the number of pulses in said pulse train in a selected time period being a function of the magnitude of said capacitive change;
    digital circuit means for counting the number of pulses in said pulse train in said selected time period to generate a present count;
    digital storage means for storing a selected reference count;
    digital comparator means for comparing said present count with said reference count and to generate an error signal responsive to a difference between said present count and said reference count;
    means for generating a corrective signal responsive to said error signal;
    means for updating said reference count in a direction selected to make said reference count equal to said present count;
    load driver means adjustable to control the power level from a power source to a load at a selected power level; and
    means for connecting said corrective signal to said load drive means to adjust the selected power level in response to said corrective signal.

2. A touch responsive power control system as set forth in claim 1 including delay means for delaying the application of said corrective signal to said load driver means until preselected conditions are satisfied.

3. A touch responsive power control system as set forth in claim 2 in which said delay means includes time delay means for delaying the application of said corrective signal to said load driver means until said error signal has persisted for a selected time period.

4. A touch responsive power control system as set forth in claim 2 in which said delay means includes means for delaying the application of said corrective signal to said load driver means until said error signal has persisted for a selected number of said selected time periods.

5. A touch responsive power control system as set forth in claim 1 in which said digital comparator means includes a binary comparator having one input bus for receiving said present count and a second input bus for receiving said reference count and means for producing an output signal in response to a difference between said present count and said reference count.

6. A touch responsive power control system as set forth in claim 1 wherein said means for connecting said corrective signal comprises means for producing a continuous adjustment in the selected power levels of said load driver in response to said corrective signal.

7. A touch responsive power control system as set forth in claim 6 including means for controlling the rate of said continuous adjustment in the selected power levels of said load driver.

8. A touch responsive power control system as set forth in claim 7 including means for controlling said rate of adjustment such that the rate of adjustment in one direction differs from that in the opposite direction.

9. A touch responsive power control system as set forth in claim 1 further comprising means for delaying said updating of said reference count.

10. A touch responsive power control system as set forth in claim 1 wherein said means for connecting said corrective signal comprises means for producing a single incremental adjustment in the selected power level of said load driver in response to said corrective signal.

11. A touch responsive power control system comprising:
   circuit means having a control input producing a capacitive change responsive to human touch;
   means responsive to said capacitive change for generating a digital pulse train, the number of pulses in said pulse train in a selected time period being a function of the magnitude of said capacitive change;
   a first binary counter for counting the number of pulses in said pulse train during said selected time period, said first binary counter having a parallel load input bus for loading in parallel a digital word, and having an overflow output bus for producing an output signal when the capacity of said counter is exceeded;
   a second binary counter for storing said digital word, said second binary counter having an output bus connected to said parallel load input bus;
   means for generating a corrective signal responsive to said output signal;
   load driver means adjustable to control the power level from a power source to a load at a selected power level; and
   means for connecting said corrective signal to said load driver means to adjust the selected power level in response to said corrective signal.

12. A touch responsive power control system as in claim 11, wherein said means for connecting said corrective signal comprises means for producing a continuous adjustment in the selected power levels of said load driver in response to said corrective signal.

13. A touch responsive power control system as in claim 12, further comprising means for controlling the rate of said continuous adjustment in the selected power levels of said load driver.

14. A touch responsive power control system as in claim 13, further comprising means for controlling said rate of adjustment such that said rate of adjustment in one direction differs from that in the opposite direction.

15. A touch responsive power control system as in claim 11, further comprising delay means for delaying the application of said corrective signal to said load driver means until preselected conditions are satisfied.

16. A touch responsive power control system as in claim 15, wherein said delay means comprises time delay means for delaying the application of said corrective signal until said error signal has persisted for a selected time period.

17. A touch responsive power control system as in claim 15, wherein said delay means comprises means for delaying the application of said corrective signal until said error signal has persisted for a selected number of said selected time periods.

18. A touch responsive power control system as in claim 11, further comprising means for enabling and disenabling said second binary counter to control the parallel loading of said digital word.

19. A touch responsive power control system as in claim 18, wherein said enabling and disenabling means further comprise means for first activating the disenabling function and, after a selected time period, activating the enabling function.

20. A touch responsive power control system as in claim 11, wherein said means for connecting said corrective signal comprises means for producing a single incremental adjustment in the selected power level of said load driver in response to said corrective signal.

* * * * *